(12) United States Patent
Jao et al.

(10) Patent No.: US 7,638,865 B2
(45) Date of Patent: Dec. 29, 2009

(54) SENSOR PACKAGE

(75) Inventors: Ching-Lung Jao, Taipei Hsien (TW); Yu-Te Chou, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 188 days.

(21) Appl. No.: 11/964,791

(22) Filed: Dec. 27, 2007

(65) Prior Publication Data

US 2009/0102004 A1 Apr. 23, 2009

(30) Foreign Application Priority Data

Oct. 18, 2007 (CN) .................... 2007 1 0202119

(51) Int. Cl.
*H01L 23/08* (2006.01)
(52) U.S. Cl. ................ 257/680; 257/E23.009; 257/E23.192
(58) Field of Classification Search ................ 257/434, 257/680, E23.009, 23.192
See application file for complete search history.

(56) References Cited

U.S. PATENT DOCUMENTS

| 6,791,076 B2 | 9/2004 | Webster | |
| 7,215,015 B2 * | 5/2007 | Moden | 257/680 |
| 7,511,367 B2 * | 3/2009 | Minamio | 257/680 |
| 2003/0209772 A1 * | 11/2003 | Prabhu | 257/434 |
| 2004/0056180 A1 * | 3/2004 | Yu | 250/214.1 |
| 2006/0152142 A1 * | 7/2006 | Nishitani et al. | 313/504 |
| 2008/0066802 A1 * | 3/2008 | Reddy | 136/258 |
| 2009/0121302 A1 * | 5/2009 | Lin et al. | 257/432 |

* cited by examiner

*Primary Examiner*—Allan R. Wilson

(57) ABSTRACT

A sensor package includes an image sensing chip having a front surface, a plurality of bumps, a glass cover plate, and a connector. The plurality of bumps are formed on the front surface, and are electrically connected to the image sensing chip. The glass cover plate has a bottom surface facing the front surface, and the glass cover plate has a plurality of transparent conductive wires formed on the bottom surface. A terminal of each of the transparent conductive wires is electrically connected to a respective bump, and another terminal of each of the transparent conductive wires extends out of an orthogonal projection area of the image sensing chip on the bottom surface. The connector is electrically connected to the another terminal of each of the transparent conductive wires.

8 Claims, 3 Drawing Sheets

SENSOR PACKAGE

BACKGROUND

1. Field of the Invention

The present invention relates to semiconductor technology, and particularly, to a semiconductor sensor package.

2. Description of Related Art

Semiconductor packages, such as a sensor package tend to be small and highly-integrated. Referring to FIG. 3, a typical sensor package 10 includes a substrate 1, a plurality of conductive pads 2, a semiconductor chip 3, and a plurality of wires 4, a plurality of conductive pins 5, a spacer 6, and a glass cover plate 7. A recess 8 is defined in the substrate 1 for accommodating the semiconductor chip 3. One terminal of each wire 4 is electrically connected to the semiconductor chip 3, and another terminal of each wire 4 is electrically connected to each conductive pad 2, and the plurality of conductive pads 2 are electrically connected to the plurality of conductive pins 5, respectively. The spacer 6 is arranged between the glass cover plate 7 and the conductive pad 2, and round the recess 8. The glass cover plate 7 is attached to the spacer 6 in a manner that the semiconductor chip 3 is sealed by glass cover plate 7.

However, a substrate 1 is needed for supporting and accommodating the semiconductor chip 3. Therefore, weight and volume of the sensor package 10 is increased.

What is needed, therefore, is to provided a sensor package with decreased weight and volume.

SUMMARY

The present invention relates to a sensor package. The sensor package includes an image sensing chip having a front surface, a plurality of bumps, a glass cover plate, and a connector. The plurality of bumps are formed on the front surface, and are electrically connected to the image sensing chip. The glass cover plate has a bottom surface facing the front surface, and the glass cover plate has a plurality of transparent conductive wires formed on the bottom surface. A terminal of each of the transparent conductive wires is electrically connected to a respective bump, and another terminal of each of the transparent conductive wires extends out of an orthogonal projection area of the image sensing chip on the bottom surface. The connector is electrically connected to the another terminal of each of the transparent conductive wires.

Other advantages and novel features of the present invention will become more apparent from the following detailed description of present embodiment when taken in conjunction with the accompanying drawings, in which:

DETAILED DESCRIPTION OF THE EMBODIMENT

Reference will now be made to the figures to describe the at least one present embodiment in detail.

Figure 1:
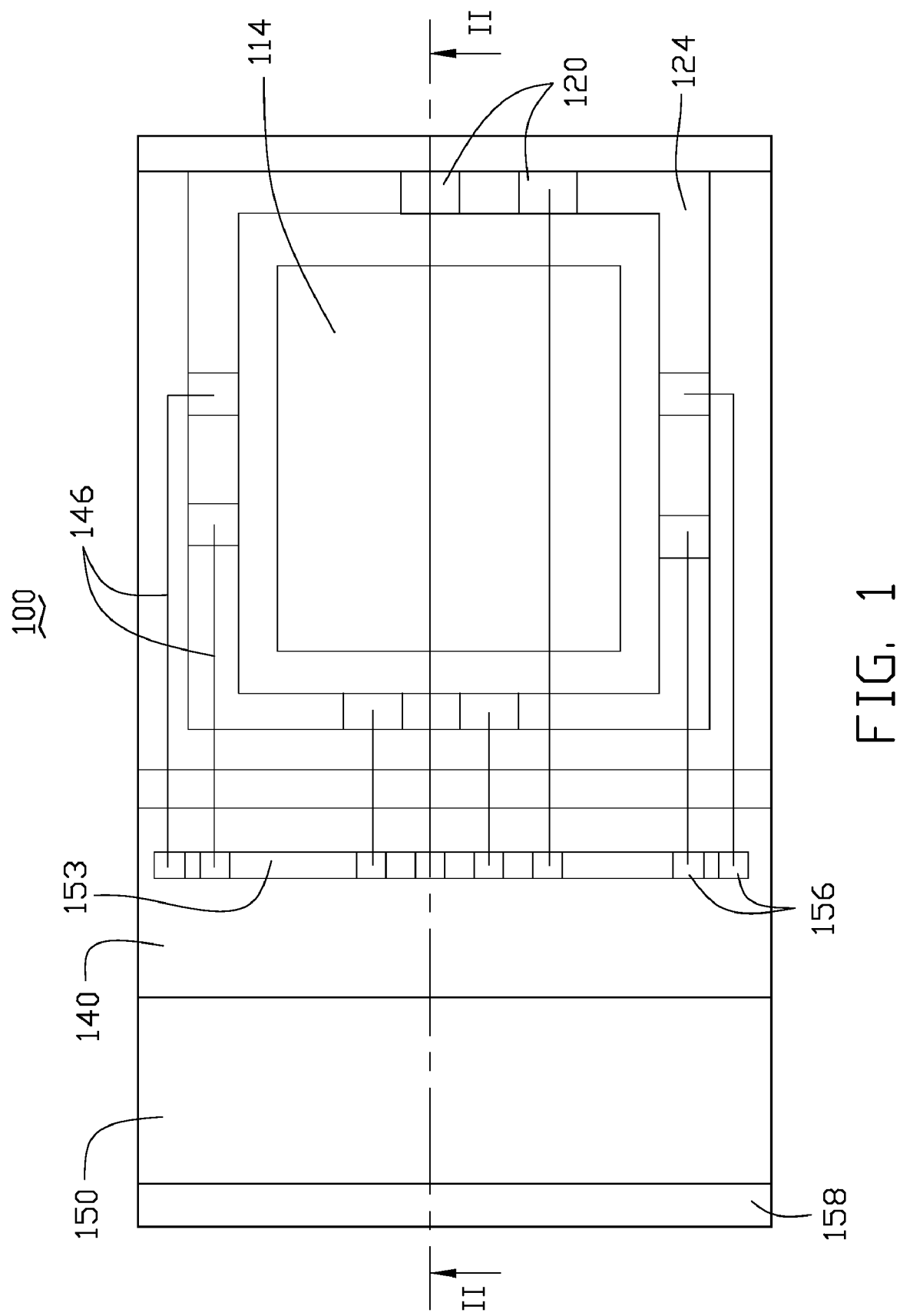
FIG. 1 is a plane view of a sensor package, in accordance with a present embodiment.
Figure 2:
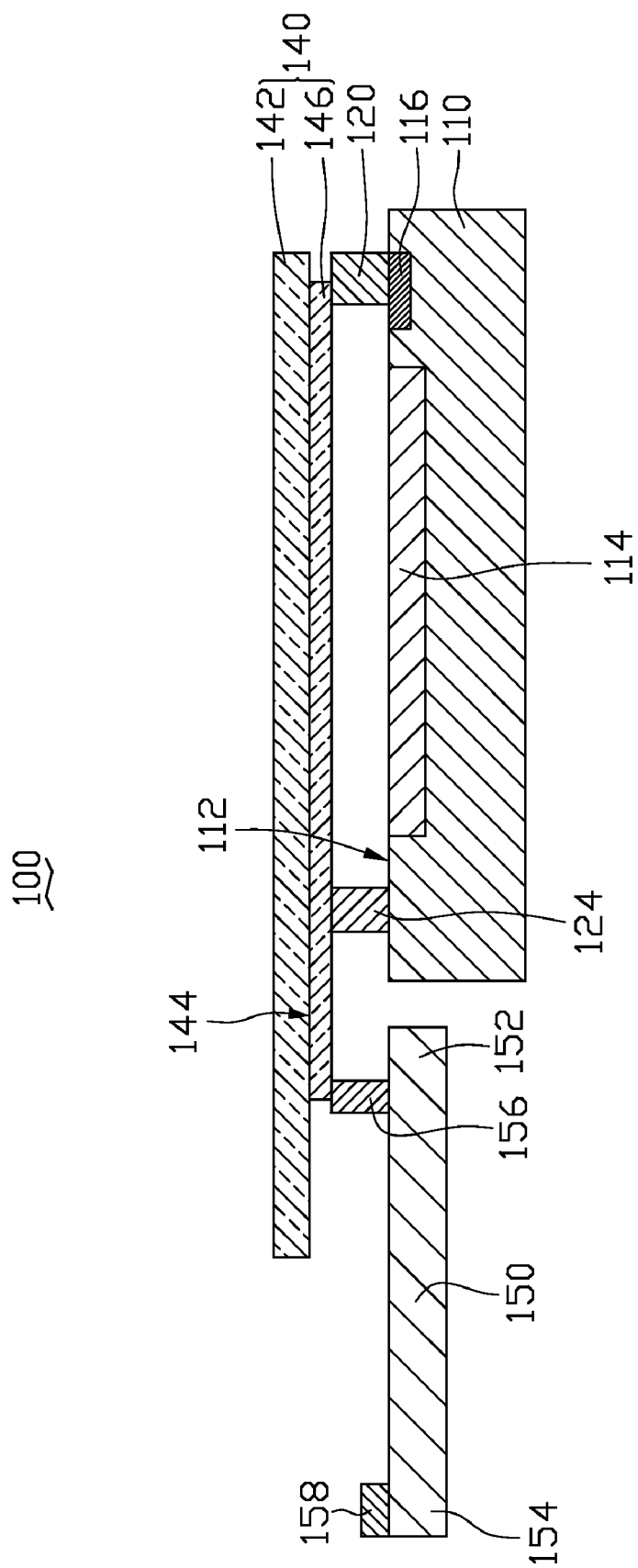
FIG. 2 is a cross-sectional view taken along line II-II of FIG. 1.
Figure 3:
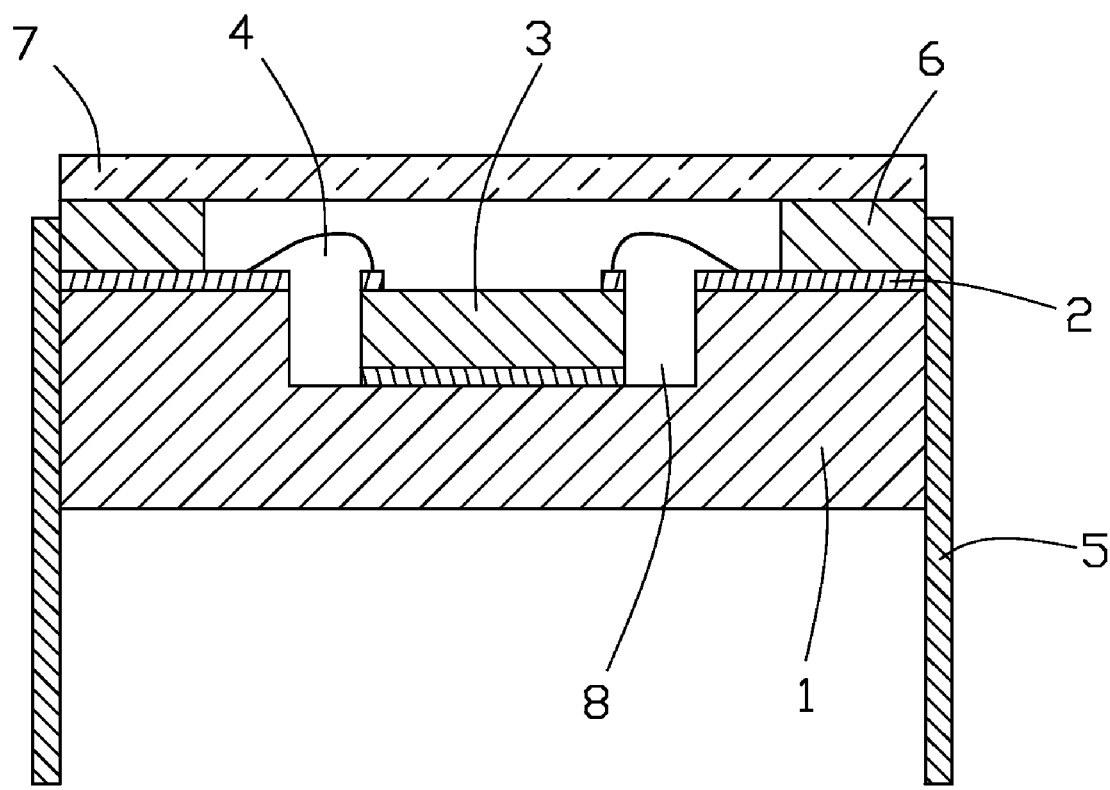
FIG. 3 is a schematic, cross-sectional view of a typical sensor package.

Referring to FIGS. 1 and 2, a sensor package 100, according to a present embodiment, is shown. The sensor package 100 includes an image sensing chip 110, a plurality of bumps 120, a glass cover plate 140, and a connector 150.

The image sensing chip 110 is a complementary metal-oxide semiconductor (CMOS) or a charge-coupled device (CCD) for converting light signals into electrical signals. The image sensing chip 110 includes a front surface 112, and has a sensing area 114 for receiving light on the front surface 112. The image sensing chip 110 is provided with a plurality of soldering pads 116 on the front surface 112, and round the sensing area 114. Beneficially, quantity of the soldering pads 116 is same as that of the bumps 120. For preventing the sensing area 114 from accumulating dust, a first insulated adhesive 124 is arranged around the sensing area 114; and the glass cover plate 140, the first insulated adhesive 124, and the plurality of bumps 120 cooperatively seal the sensing area 114. Each bump 120 is a metallic bump.

The glass cover plate 140 includes a substrate 142 and a plurality of transparent conductive wires 146. The substrate 142 includes a bottom surface 144 facing the front surface 112 of the image sensing chip 110, and the plurality of transparent conductive wires 146 are formed on the bottom surface 144 so that some of the conductive wires 146 go across a part of the bottom surface 144 that faces toward sensing area 114. A length of the glass cover plate 140 along a cross-sectional view, as shown in FIG. 2, is greater than that of the image sensing chip 110. Therefore, a terminal of each transparent conductive wire 146 extends out of an orthogonal projection area of the image sensing chip 110 on the bottom surface 144, also as shown in FIG. 2. The plurality of conductive wires 146 are electrically connected to the plurality of bumps 120, and the plurality of bumps 120 and the first insulated adhesive 124 cooperatively make the image sensing chip 110 electrically and firmly attached to the glass cover plate 140. A material of the transparent conductive wires 146 is indium tin oxide (ITO) or carbon nanotubes.

The connector 150 includes a first connecting end 152 and a second connecting end 154. The connector 150 has a joint 158 arranged on the second connecting end 154, and has a plurality of connecting pads 156 spaced from each other on the first connecting end 152. The joint 158 is configured for being connected to a main circuit board (not shown) of an electronic device. The plurality of connecting pads 156 are electrically connected to the plurality of bumps 120 via the plurality of transparent conductive wires 146 respectively. For better structural connections, a second insulated adhesive 153 is filled in spaces between the plurality of connecting pads 146. Beneficially, the connector 150 is a flexible printed circuit board (FPCB).

Since the transparent conductive wires 146 are used in the sensor package 100, a substrate for supporting the image sensing chip 110 may be omitted from the sensor package 100. Therefore, weight and volume of the sensor package 100 is decreased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A sensor package, comprising:
   an image sensing chip having a front surface;
   a plurality of bumps being formed on the front surface, and electrically connected to the image sensing chip;

a glass cover plate having a bottom surface facing the front surface, the glass cover plate having a plurality of transparent conductive wires formed on the bottom surface, a terminal of each of the transparent conductive wires being electrically connected to a respective bump, another terminal of each of the transparent conductive wires extending out of an orthogonal projection area of the image sensing chip on the bottom surface; and a connector being electrically connected to the another terminal of each of the transparent conductive wires.

2. The sensor package as claimed in claim 1, wherein the image sensing chip has a sensing area for converting light signals into electrical signals on the front surface.

3. The sensor package as claimed in claim 2, further comprising a first insulated adhesive being arranged round the sensing area, and the glass cover plate, and wherein the first insulated adhesive, and the plurality of bumps cooperatively seal the sensing area.

4. The sensor package as claimed in claim 2, wherein the plurality of transparent conductive wires are formed on the bottom surface so that some of the conductive wires go across a part of the bottom surface that faces toward the sensing area.

5. The sensor package as claimed in claim 1, wherein the connector includes a plurality of connecting pads electrically connected to the plurality of transparent conductive wires respectively.

6. The sensor package as claimed in claim 5, further comprising a second insulated adhesive filled in spaces between the plurality of connecting pads.

7. The sensor package as claimed in claim 1, wherein a material of the plurality of transparent conductive wires is indium tin oxide or carbon nanotubes.

8. The sensor package as claimed in claim 1, wherein the plurality of bumps is metallic bumps.

* * * * *